(12) United States Patent
Wang et al.

(10) Patent No.: US 7,838,966 B2
(45) Date of Patent: Nov. 23, 2010

(54) SEMICONDUCTOR DEVICES INCLUDING RESISTOR ELEMENTS COMPRISING A BRIDGE AND BASE ELEMENTS AND RELATED METHODS

(75) Inventors: Xiao Quan Wang, Gyeonggi-do (KR); Chang-Bong Oh, Gyeonggi-do (KR); Seung-Hwan Lee, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 503 days.

(21) Appl. No.: 11/825,181

(22) Filed: Jul. 5, 2007

(65) Prior Publication Data

US 2008/0054405 A1 Mar. 6, 2008

(30) Foreign Application Priority Data

Sep. 4, 2006 (KR) ...................... 10-2006-0084756

(51) Int. Cl.
*H01L 23/62* (2006.01)
(52) U.S. Cl. .................. 257/536; 257/537; 257/538; 257/543; 257/E29.003; 257/E21.004; 338/320; 438/190; 438/210; 438/171
(58) Field of Classification Search .................. 257/538, 257/E21.004, 536, 537, 543, E29.003; 438/171, 438/190, 210; 338/320
See application file for complete search history.

(56) References Cited

U.S. PATENT DOCUMENTS

| | | | |
|---|---|---|---|
| 6,489,881 B1 * | 12/2002 | Aleksandravicius et al. . | 338/307 |
| 6,501,136 B1 | 12/2002 | Lin | |
| 2003/0052386 A1 * | 3/2003 | Yamaguchi ................. | 257/536 |
| 2003/0052387 A1 | 3/2003 | Boeck et al. | |
| 2004/0196138 A1 | 10/2004 | Thei et al. | |
| 2005/0133864 A1 * | 6/2005 | Iwamatsu et al. ........... | 257/347 |

FOREIGN PATENT DOCUMENTS

| | | |
|---|---|---|
| JP | 60-153137 | 8/1985 |
| JP | 2005-079514 | 3/2005 |
| KR | 10-1997-0053786 | 7/1997 |
| KR | 10-2001-0107108 A | 12/2001 |
| KR | 10-2001-0107249 A | 12/2001 |
| KR | 10-2006-0077872 A | 7/2006 |

* cited by examiner

*Primary Examiner*—Kenneth A Parker
*Assistant Examiner*—David Z Chen
(74) *Attorney, Agent, or Firm*—Myers Bigel Sibley & Sajovec, P.A.

(57) ABSTRACT

A semiconductor device may include a resistance pattern including a resistance material on a substrate. The resistance pattern may include first and second spaced apart base elements, a bridge element, and first, second, third, and fourth extension elements. The first and second base elements may be substantially parallel, and the bridge element may be connected between respective center portions of the first and second spaced apart base elements. The first and second extension elements may be connected to opposite ends of the first base element and may extend toward the second base element, and the third and fourth extension elements may be connected to opposite ends of the second base element and may extend toward the first base element. Related methods are also discussed.

16 Claims, 11 Drawing Sheets

SEMICONDUCTOR DEVICES INCLUDING RESISTOR ELEMENTS COMPRISING A BRIDGE AND BASE ELEMENTS AND RELATED METHODS

RELATED APPLICATION

This application claims priority to Korean Application Serial No. 2006-84756, filed Sep. 4, 2006, the disclosure of which is hereby incorporated herein by reference.

FIELD OF THE INVENTION

The present invention relates to electronics and, more particularly, to semiconductor devices and related methods.

BACKGROUND OF THE INVENTION

In general, a semiconductor device may include semiconductor resistor elements together with transistors to input and output data at a given time. A semiconductor resistor element may be made using a diffusion region formed by implanting impurity ions into a semiconductor substrate and/or using a resistance pattern formed of a semiconductor material on the semiconductor substrate. Here, the semiconductor resistor element may maintain an appropriate resistance value to process data at a given time and contribute to a resistance-capacitance delay time of circuit interconnections.

As dimensions of semiconductor devices decrease, the semiconductor resistor element may be formed in a resistance pattern occupying a relatively small area on and/or in the semiconductor substrate. Further, a semiconductor resistor element may be deformed due to optical interference when performing a photolithography process as a result of reduction of semiconductor device dimensions. A resistance of the semiconductor resistor element may be reduced, thereby changing circuit timing and reducing performance.

A semiconductor resistor element used to compensate for optical interference when performing a photolithography process with reduced semiconductor device dimensions is discussed, for example, in U.S. Patent Publication No. 2004-0196138 by Kong Beng Thei et al. As discussed in U.S. Patent Publication No. 2004-0196138, resistor element and dummy resistor elements may be disposed on a substrate. The dummy resistor elements may be formed parallel to the resistor element, without contacting the resistor element. Thus, the dummy resistor elements may compensate for optical interference affecting formation of the resistor element during photolithography operations.

However, it may be difficult to provide a resistor element having a resistance less than or equal to a resistance provided before the reduction of dimensions of the semiconductor device, because the resistor element is disposed on the substrate electrically separated from the dummy resistor elements. Use of the dummy resistor elements may not provide sufficient flexibility in a semiconductor fabrication process which allows the resistance to be less than or equal to a resistance before reduction of dimensions of the semiconductor device. Therefore, the resistor element may have a larger resistance value than before reduction of dimensions, and thus may be unable to process data at the given time.

SUMMARY OF THE INVENTION

According to some embodiments of the present invention, a semiconductor device may include a substrate and a resistance pattern comprising a resistance material on the substrate. More particularly, the resistance pattern may include first and second spaced apart base elements wherein the first and second base elements are substantially parallel, and a bridge element connected between respective center portions of the first and second spaced apart base elements. In addition, first and second extension elements may be connected to opposite ends of the first base element and may extend toward the second base element, and third and fourth extension elements may be connected to opposite ends of the second base element and may extend toward the first base element.

The first, second, third, and fourth extension elements of the resistance pattern may be parallel with respect to the bridge element of the resistance pattern, and/or the bridge element may be perpendicular with respect to the first and second base elements. The resistance material may include doped polysilicon. Moreover, the substrate may include a semiconductor layer and an insulating pad layer on the semiconductor layer so that the insulating pad layer is between the semiconductor layer and the resistance pattern.

According to some other embodiments of the present invention, a method of forming semiconductor device may include forming a resistance pattern comprising a resistance material on a substrate. The resistance pattern may include first and second spaced apart base elements, a bridge element, and first, second, third, and fourth extension elements. The first and second base elements may be substantially parallel, and the bridge element may be connected between respective center portions of the first and second spaced apart base elements. In addition, the first and second extension elements may be connected to opposite ends of the first base element and may extend toward the second base element, and the third and fourth extension elements may be connected to opposite ends of the second base element and may extend toward the first base element.

The first, second, third, and fourth extension elements of the resistance pattern may be parallel with respect to the bridge element of the resistance pattern, ad/or the bridge element may be perpendicular with respect to the first and second base elements. The resistance material may include doped polysilicon. In addition, the substrate may include a semiconductor layer and an insulating pad layer on the semiconductor layer so that the insulating pad layer is between the semiconductor layer and the resistance pattern.

According to some embodiments of the present invention, a semiconductor resistor element may allow flexibility in a semiconductor fabrication process.

According to some other embodiments of the present invention, a method of forming a semiconductor resistor element may provide flexibility in a semiconductor fabrication process.

According to some embodiments of the present invention, a semiconductor resistor element may include a resistance pattern on a semiconductor substrate, and the resistance pattern may include extensions and first to third patterns. The first to third patterns may be disposed from left to right in sequence and may form an 'H' shape, and the extensions may be disposed to respectively contact upper and lower ends of the 'H' shape and may be disposed parallel to the second pattern to face the second pattern. Connection patterns may be disposed to contact the resistance pattern, spaced apart from the second pattern, and disposed on edges of the first pattern, the third pattern and the extensions. Metal interconnections may each overlap the connection patterns and may be electrically connected with the connection patterns.

According to some other embodiments of the present invention, a semiconductor resistor element may include a resistance pattern disposed on a semiconductor substrate and may include connection parts, extensions and first to third patterns. The first to third patterns may be disposed from left to right in sequence and may form an 'H' shape. The extensions may be formed to respectively contact upper and lower ends of the 'H' shape and may be disposed parallel to the second pattern to face the second pattern. The connection parts may be disposed opposite to sidewalls of the first pattern, the third pattern and the extensions facing the second pattern, and may protrude from the first pattern, the third pattern and the extensions. Connection patterns may be disposed to contact the resistance pattern on the connection parts. Metal interconnections may be disposed along the first pattern, the third pattern and the extensions and may be electrically connected with the connection patterns.

According to still other embodiments of the present invention, a method of forming a semiconductor resistor element may include forming a resistance pattern on a semiconductor substrate. The resistance pattern may be formed to have extensions and first to third patterns. The first to third patterns may be formed from left to right in sequence to form an 'H' shape, and the extensions may be formed to contact upper and lower ends of the 'H' shape and may be formed parallel to the second pattern to face the second pattern. A barrier pattern may be formed on the resistance pattern and the semiconductor substrate, and the barrier pattern may cover a central region of the resistance pattern and may expose an outer region of the resistance pattern. Connection patterns may be formed surrounding the barrier pattern and contacting the resistance pattern, and the connection patterns may be formed in the outer region of the resistance pattern. An interlayer insulating layer may be formed on the semiconductor substrate to cover the connection patterns and the barrier pattern. Plugs may be formed passing through predetermined regions of the interlayer insulating layer and contacting the connection patterns. Metal interconnections may be formed on the interlayer insulating layer to respectively contact the plugs.

According to yet other embodiments of the present invention, a method of forming a semiconductor resistor element may include forming a resistance pattern on a semiconductor substrate, and the resistance pattern may include connection parts, extensions and first to third patterns. The first to third patterns may be formed from left to right in sequence to form an 'H' shape. The extensions may be formed to respectively contact upper and lower ends of the 'H' shape and may be disposed parallel to the second pattern to face the second pattern. The connection parts may be disposed on edges opposite to sidewalls of the first pattern, the third pattern and the extensions facing the second pattern and may protrude from the first pattern, the third pattern and the extensions. A buried insulating layer may be on the resistance pattern. Connection patterns may be formed passing through the buried insulating layer and respectively contacting the connection parts. A planarization interlayer insulating layer may be formed on the buried insulating layer to cover the connection patterns. Plugs may be formed passing through the planarization interlayer insulating layer and respectively contacting the connection patterns. Metal interconnections may be formed on the planarization interlayer insulating layer to contact the plugs.

DETAILED DESCRIPTION

Figure 1:
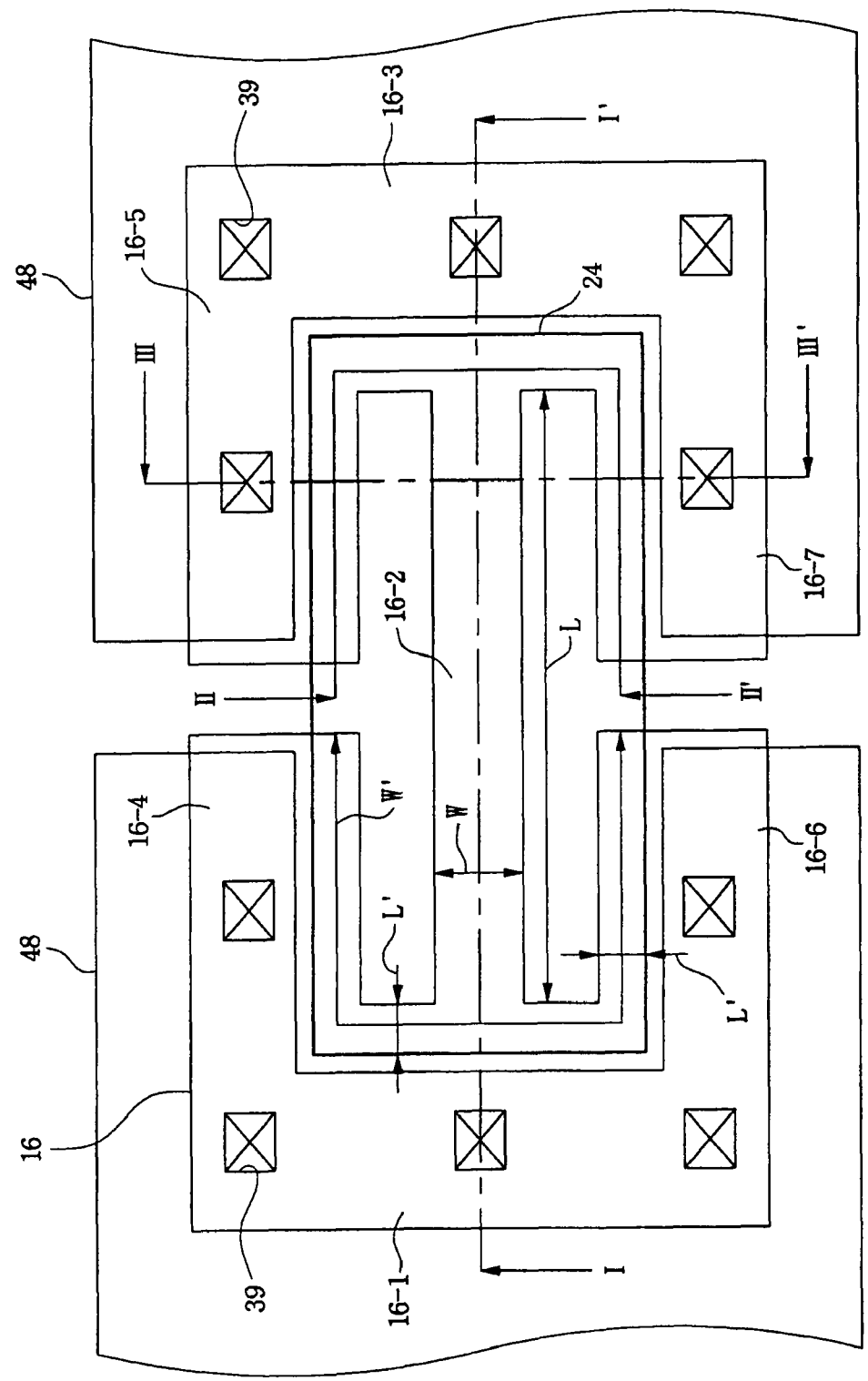
FIGS. 1 and 7 are plan views illustrating semiconductor resistor elements according to embodiments of the present invention.
Figure 2A:
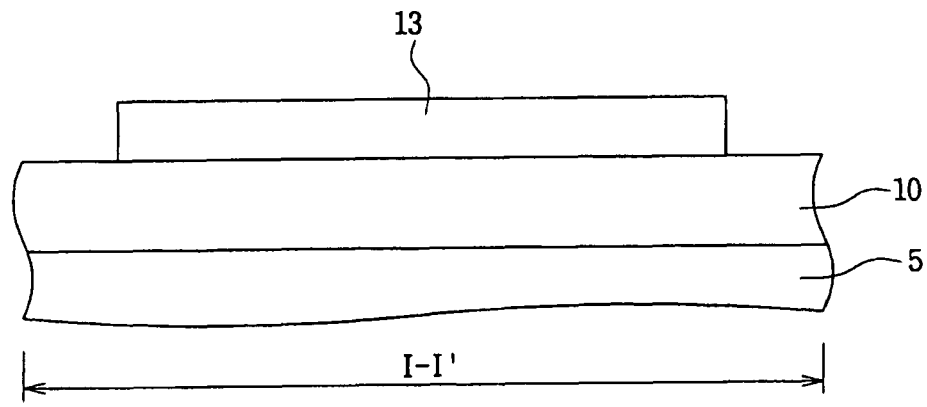
FIGS. 2a-c, 3a-c, 4a-c, 5a-c and 6a-c are respective cross-sectional views taken along lines I-I', II-II' and III-III' of FIG. 1 which illustrate methods of forming semiconductor resistor elements according to some embodiments of the present invention.
Figure 2B:
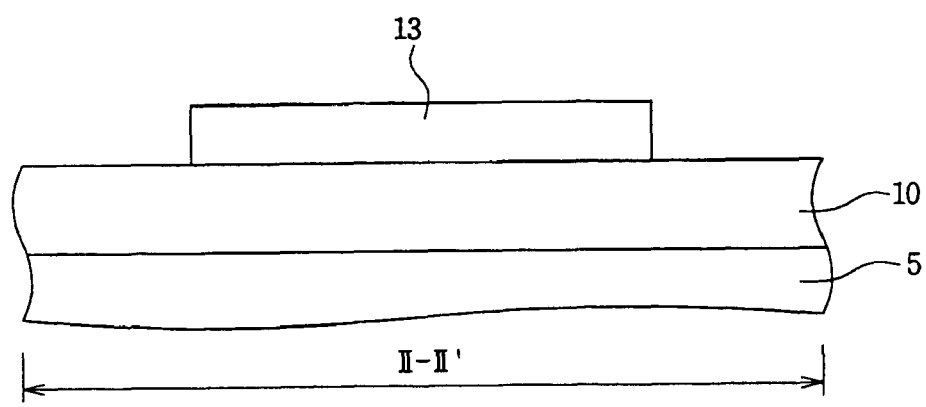
Figure 2C:
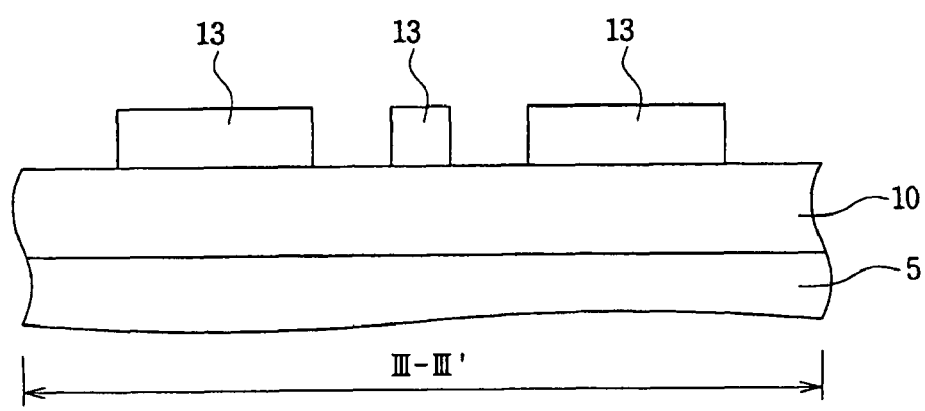

The present invention is described more fully hereinafter with reference to the accompanying drawings, in which embodiments of the present invention are shown. This invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein. All publications, patent applications, patents, and other references mentioned herein are incorporated by reference in their entirety.

Figure 6A:
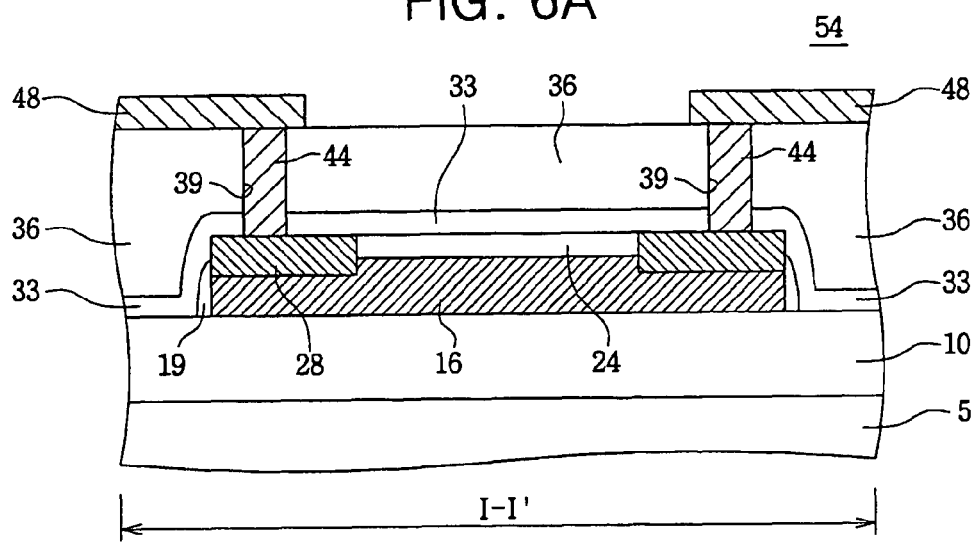
Figure 6B:
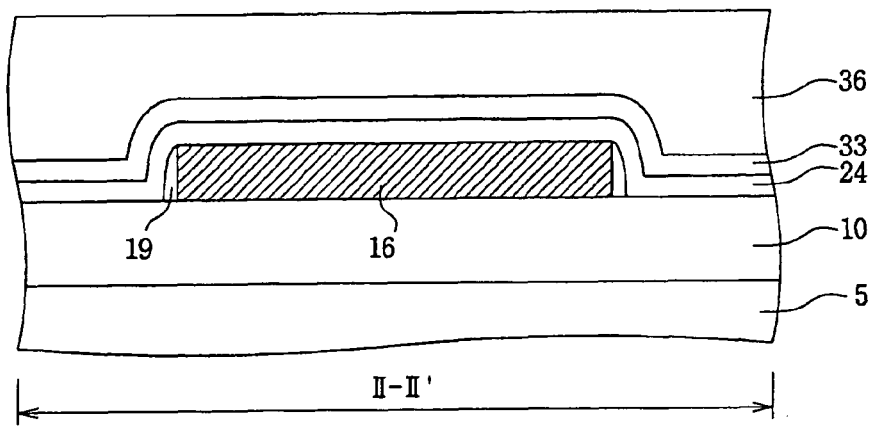
Figure 6C:
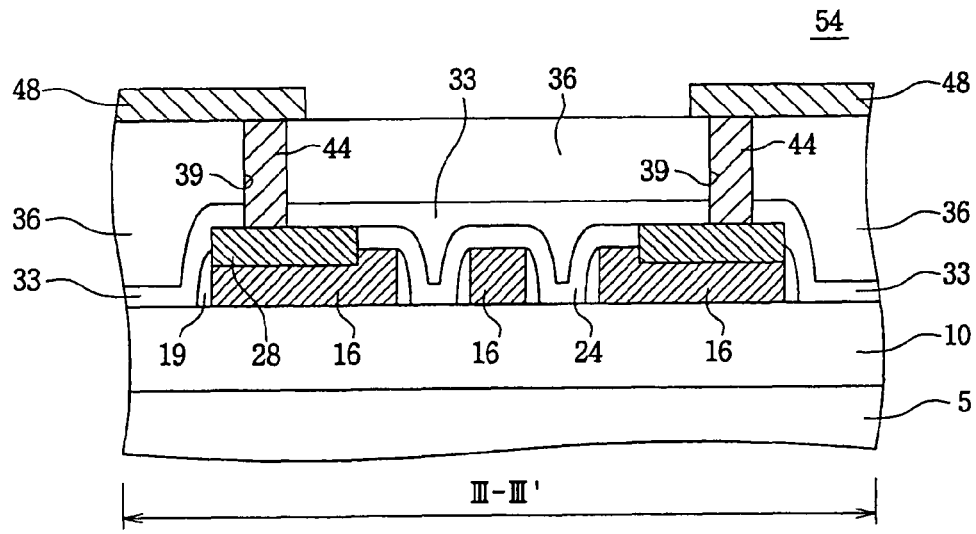

FIG. 1 is a plan view showing a semiconductor resistor element according to first embodiments of the present invention, and FIGS. 6a-c are respective cross-sectional views taken along lines I-I', II-II' and III-III' of FIG. 1.

Referring to FIGS. 1 and 6a-c, a semiconductor resistor element 54 according to some embodiments of the present invention may include first to third patterns 16-1 (also referred to as a base element), 16-2 (also referred to as a bridge element) and 16-3 (also referred to as a base element). The first to third patterns 16-1, 16-2 and 16-3 may be disposed from left to right in sequence to form an 'H' shape according to the arrangement illustrated in FIG. 1. The second pattern 16-2 may have a length L and a width W to provide a resistance portion of the semiconductor resistor element 54. The first to third patterns 16-1, 16-2 and 16-3 may be disposed on a semiconductor substrate 5 as shown in FIGS. 6a-c. The first to third patterns 16-1, 16-2 and 16-3 may be patterns of doped polysilicon. The first to third patterns 16-1, 16-2 and 16-3 may have N- or P-type conductivity.

Extensions 16-4, 16-5, 16-6 and 16-7 (also referred to as extension elements) contacting the first and third patterns 16-1 and 16-3 may be provided as shown in FIG. 1. The extensions 16-4, 16-5, 16-6 and 16-7 may each contact upper and lower ends of the 'H' shape to be parallel to the second pattern 16-2 and to face the second pattern 16-2. Moreover, the extensions 16-4, 16-5, 16-6 and 16-7 may be disposed to protrude from the upper and lower ends of the 'H' shape to face one another. The extensions 16-4, 16-5, 16-6 and 16-7 may include doped polysilicon. The extensions 16-4, 16-5, 16-6 and 16-7 may have N- or P-type conductivity.

The first to third patterns 16-1, 16-2 and 16-3 and the extensions 16-4, 16-5, 16-6 and 16-7 may constitute one resistance pattern 16 as shown in FIGS. 1 and/or 6a-c. Connection patterns 28 (also referred to as conductive patterns) contacting the resistance pattern 16 may be disposed as shown in FIGS. 6a-c. More specifically, the connection patterns 28 may be disposed apart from the second pattern 16-2 on edges of the first pattern 16-1, the third pattern 16-3, and the extensions 16-4, 16-5, 16-6 and 16-7 as shown in FIG. 1. The connection patterns 28 may include metal silicide. The metal silicide, for example, may be a nickel silicide (NiSi), a cobalt silicide (CoSi), and/or a tungsten silicide (WSi).

A barrier pattern 24 (also referred to as an insulating barrier layer) may be provided on the resistance pattern 16 and the semiconductor substrate 5, and the barrier pattern 24 may be surrounded by the connection patterns 28 as shown in FIGS. 1 and/or 6a-c. The barrier pattern 24 may cover the second pattern 16-2 and may be disposed on edges of the first pattern 16-1, the third pattern 16-3, and edges of the extensions 16-4, 16-5, 16-6 and 16-7 adjacent to the second pattern 16-2. The barrier pattern 24 and the connection patterns 28 may allow the first pattern 16-1, the third pattern 16-3, and the extensions 16-4, 16-5, 16-6 and 16-7 to provide resistance portions of the semiconductor resistor element 54 to having a length L' and a width W'. More particularly, W' may be much greater than W, and L' may be much less than L, so that a combined resistance is dominated by the second pattern 16-2 (also referred to as a bridge element). The barrier pattern 24 may include an insulating material. The barrier pattern 24, for example, may be formed of silicon oxide ($SiO_2$) and/or silicon nitride ($Si_3N_4$). A pad layer 10 may be provided between the semiconductor substrate 5 and the resistance pattern 16. The pad layer 10 may include an insulating material.

Spacers 19 may be disposed on sidewalls of the first to third patterns 16-1, 16-2 and 16-3 and the extensions 16-4, 16-5, 16-6 and 16-7 as shown in FIGS. 6a-c. The spacers 19 may include an insulating material. The spacers 19, for example, may be formed of silicon nitride. Metal interconnections 48 (also referred to as conductive interconnection layers) may respectively overlap the connection patterns 28 as shown in FIGS. 1 and/or 6a-c. The metal interconnections 48 may be electrically connected with the connection patterns 28. The metal interconnections 48 may be respectively provided on the connection patterns 28 to face each other. The metal interconnections 48 may include a conductive material such as aluminum (Al) and/or copper (Cu).

A protection layer 33 and an interlayer insulating layer 36 may cover the resistance pattern 16, the spacers 19 and the connection patterns 28 under the metal interconnections 48 as shown in FIGS. 6a-c. According to other embodiments of the present invention, the protection layer 33 may be omitted. The protection layer 33 may include an insulating material. The interlayer insulating layer 36 may include at least one insulating material. Plugs 44 may penetrate regions of the interlayer insulating layer 36 and contact the metal interconnections 48 and the connection patterns 28 as shown in FIGS. 6a-c. The plugs 44 may include a conductive material such as tungsten (W). If the protection layer 33 is omitted, the plugs 44 may pass through the interlayer insulating layer 36 only.

Figure 7:
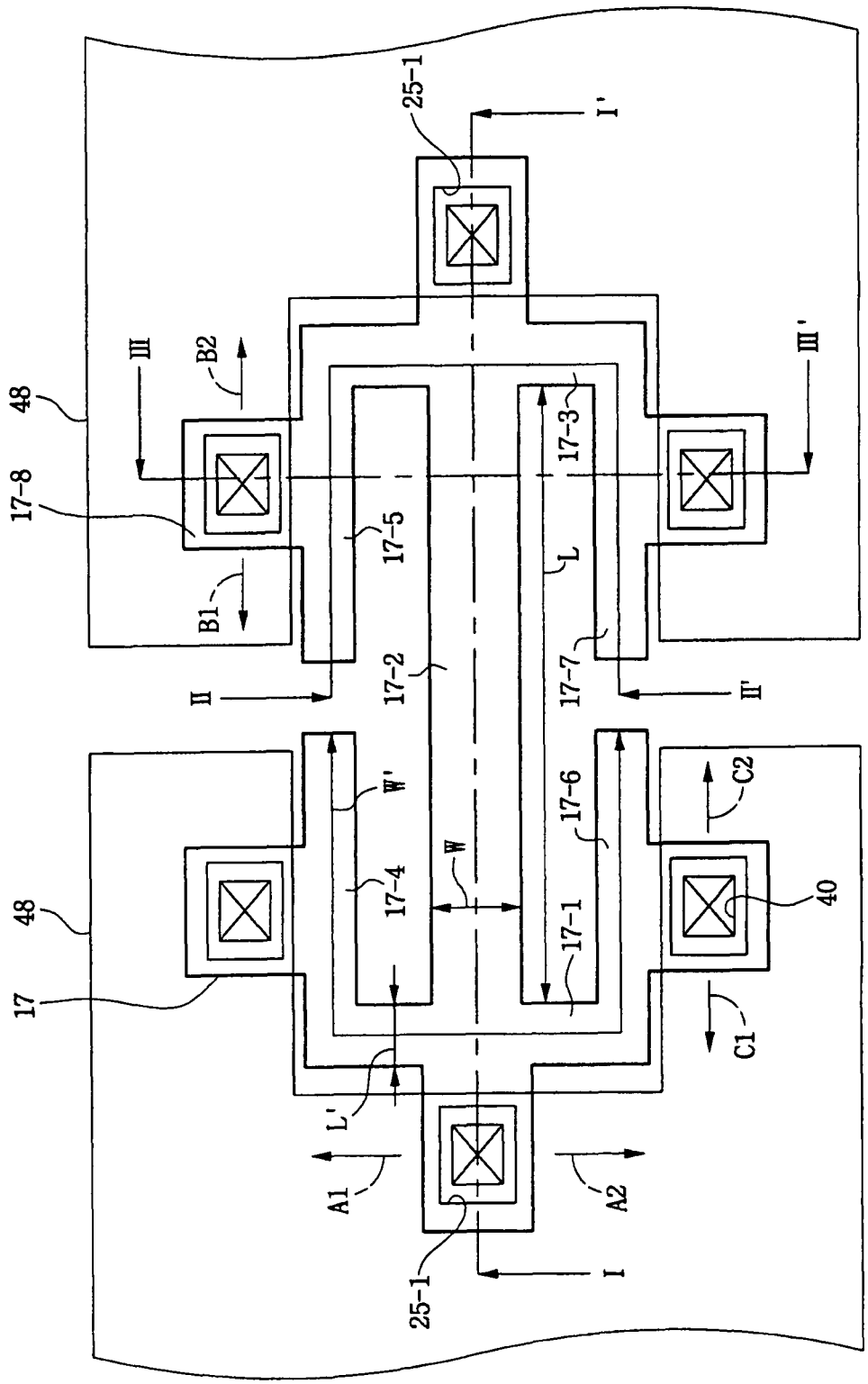
Figure 8A:
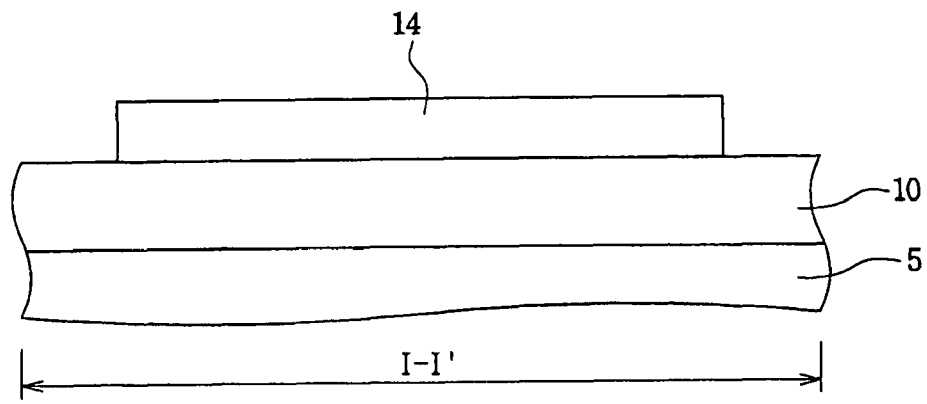
FIGS. 8a-c, 9a-c, 10a-c and 11a-c are respective cross-sectional views taken along lines I-I', II-II' and III-III' of FIG. 7 which illustrate methods of forming semiconductor resistor elements according to some embodiments of the present invention.
Figure 8B:
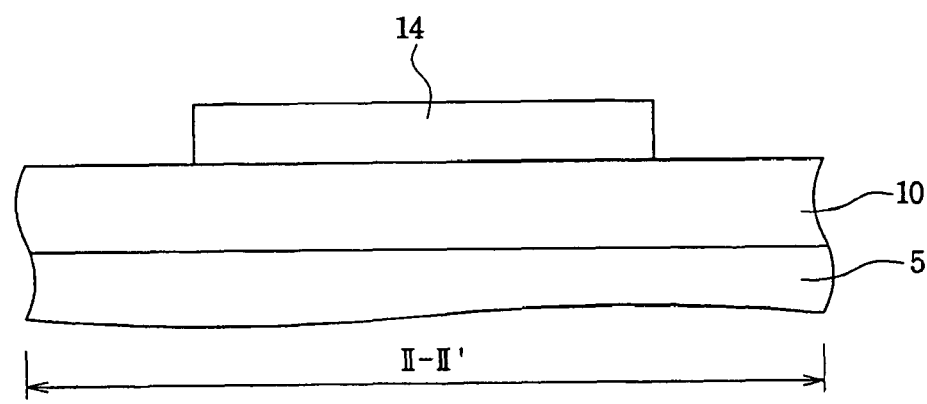
Figure 8C:
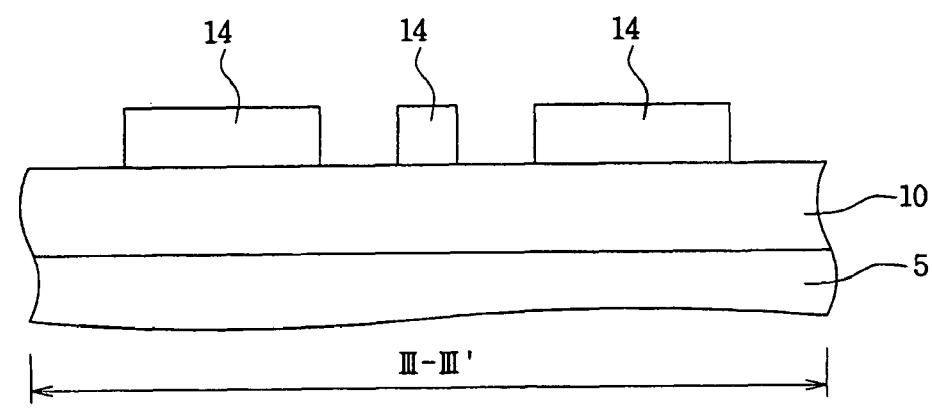

Semiconductor resistor elements according to some embodiments of the present invention will now be described with reference to FIG. 7. The same reference numerals are used to denote the same materials according to embodiments of FIGS. 1 and 7. FIG. 7 is a plan view showing a semiconductor resistor element according to some embodiments of the present invention, and FIGS. 11a-c are cross-sectional views taken along lines I-I', II-II' and III-III' of FIG. 7.

Figure 11A:
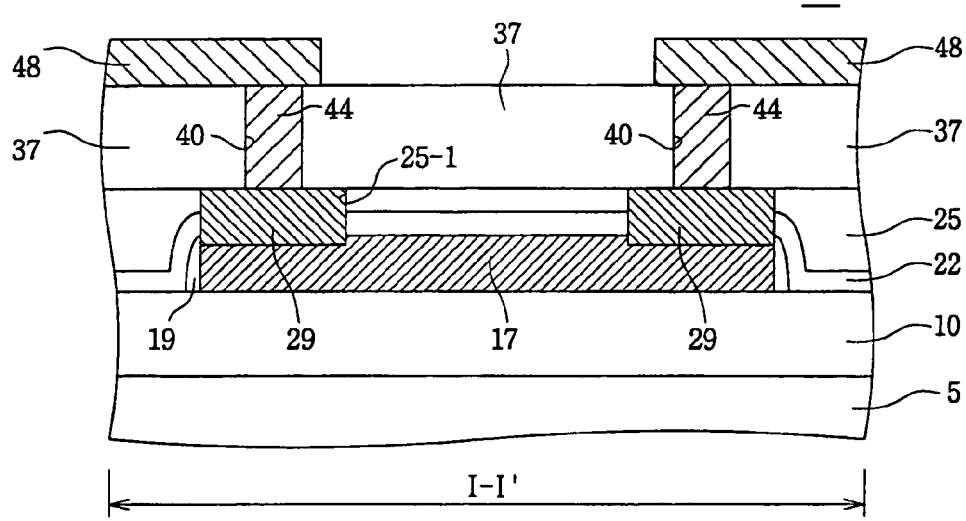
Figure 11B:
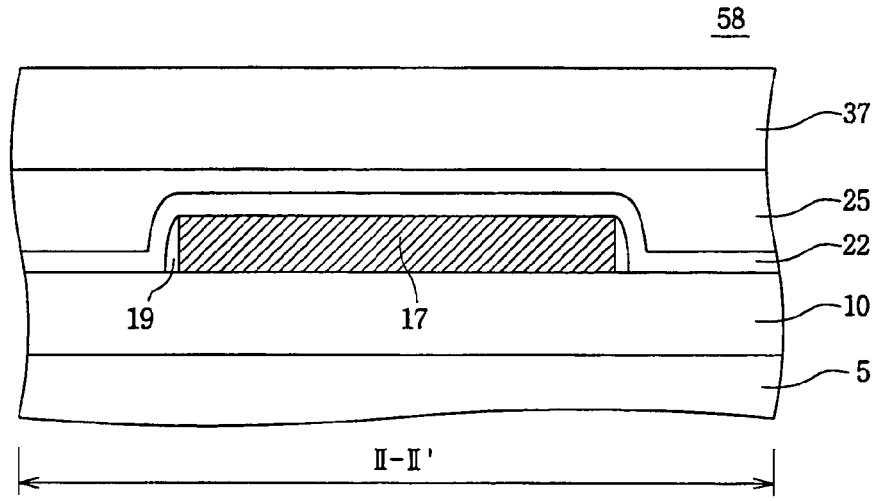
Figure 11C:
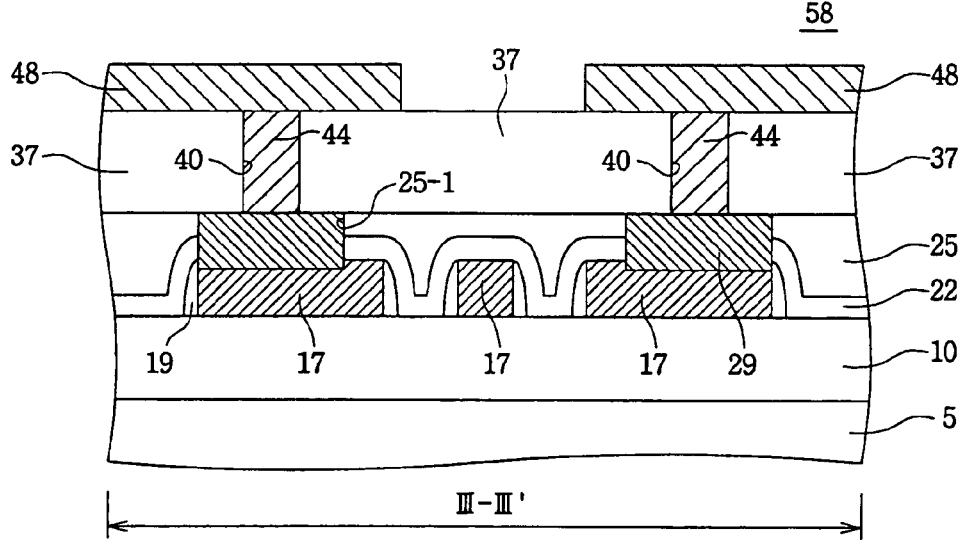

Referring to FIGS. 7 and 11a-c, a semiconductor resistor-element 58 according to some embodiments of the present invention may include first to third patterns 17-1, 17-2 and 17-3. The first to third patterns 17-1, 17-2 and 17-3 may be provided from left to right in sequence and may form an 'H' shape according to the arrangement shown in FIG. 7. The second pattern 17-2 may have a length L and a width W to provide a resistance portion of the semiconductor resistor element 58. The first to third patterns 17-1 (also referred to as a base element), 17-2 (also referred to as a bridge element) and 17-3 (also referred to as a base element) may be provided on a semiconductor substrate 5 as shown in FIGS. 11a-c to form the 'H' shape. The first to third patterns 17-1, 17-2 and 17-3 may be patterns of doped polysilicon. The first to third patterns 17-1, 17-2 and 17-3 may have N- or P-type conductivity.

Extensions 17-4, 17-5, 17-6 and 17-7 (also referred to as extension elements) may contact the first to third patterns 17-1, 17-2 and 17-3 as shown in FIG. 7. The extensions 17-4, 17-5, 17-6 and 17-7 may contact upper and lower ends of the 'H' shape and may be disposed parallel to the second pattern 17-2 to face the second pattern 17-2. The extensions 17-4, 17-5, 17-6 and 17-7 may be disposed to protrude from the upper and lower ends of the 'H' shape and to face one another. The extensions 17-4, 17-5, 17-6 and 17-7 may include doped polysilicon, and the extensions 17-4, 17-5, 17-6 and 17-7 may have N- or P-type conductivity.

Connection parts 17-8 (also referred to as connection elements) may be provided opposite to sidewalls of the first pattern 17-1, the third pattern 17-3 and the extensions 17-4, 17-5, 17-6 and 17-7 facing the second pattern 17-2 as shown in FIG. 7. The connection parts 17-8 may be provided to protrude from the first pattern 17-1, the third pattern 17-3 and the extensions 17-4, 17-5, 17-6 and 17-7. The connection parts 17-8 may include doped polysilicon, and the connection parts 17-8 may have N- or P-type conductivity. The connection parts 17-8 may provide a resistance pattern 17 together with the first to third patterns 17-1, 17-2 and 17-3 and the extensions 17-4, 17-5, 17-6 and 17-7 as shown in FIGS. 7 and/or 11a-c.

Connection patterns 29 (also referred to as conductive patterns) may contact the resistance pattern 17 as shown in FIGS. 11a-c. The connection patterns 29 may be disposed on the connection parts 17-8, respectively. The connection patterns 29 may be confined on the connection parts 17-8, respectively. The connection patterns 29 may allow the first pattern 17-1, the third pattern 17-3, and the extensions 17-4, 17-5, 17-6 and 17-7 to provide a length L' and a width W' as a resistance portion of the semiconductor resistor element 58. The connection patterns 29 may include a metal silicide such as nickel silicide (NiSi), cobalt silicide (CoSi) and/or tungsten silicide (WSi). As shown in FIG. 11, spacers 19 may be disposed on sidewalls of the first to third patterns 17-1, 17-2 and 17-3 and the extensions 17-4, 17-5, 17-6 and 17-7.

Metal interconnections 48 (also referred to as conductive interconnection layers) may be provided along the first pattern 17-1, the third pattern 17-3 and the extensions 17-4, 17-5, 17-6 and 17-7 as shown in FIGS. 7 and/or 11 a-c. The metal interconnections 48 may be electrically connected with the connection patterns 29. The metal interconnections 48 may be disposed around the first pattern 17-1, the third pattern 17-3 and the extensions 17-4, 17-5, 17-6 and 17-7 to face each other. An insulating pad layer 10 may be disposed between the semiconductor substrate 5 and the resistance pattern 17.

A barrier layer 22, a buried insulating layer 25 and a planarization interlayer insulating layer 37 may be sequentially disposed to cover the resistance pattern 17 and the spacers 19 under the metal interconnections 48 as shown in FIGS. 11a-c. According to other embodiments of the present invention, the barrier layer 22 may be omitted. Each of the buried insulating layer 25 and the planarization interlayer insulating layer 37 may include at least one insulating material. Plugs 44 may penetrate predetermined regions of the planarization interlayer insulating layer 37, buried insulating layer 25 and/or the barrier layer 22 to provide electrical connection between the metal interconnections 48 and the connection patterns 29 as shown in FIGS. 11a-c.

Methods of forming semiconductor resistor elements according to embodiments of the present invention will be described below with reference to FIGS. 1, 2a-c, 3a-c, 4a-c, 5a-c, and 6a-c. FIGS. 2a-c, 3a-c, 4a-c, 5a-c, and to 6a-c are respective cross-sectional views taken along lines I-I', II-II' and III-III' of FIG. 1 to illustrate methods of forming semiconductor resistor elements according to some embodiments of the present invention.

Referring to FIGS. 1 and 2a-c, a pad layer 10 is formed on a semiconductor substrate 5. The pad layer 10 may include an insulating material such as silicon oxide and/or silicon nitride. A resistance definition pattern 13 may be formed on the pad layer 10, and the resistance definition pattern 13 may be formed of undoped polysilicon. The resistance definition pattern 13 may be a preliminary pattern used to form the resistance pattern 16 of FIG. 1.

Referring to FIGS. 1 and 3a-c, the resistance definition pattern 13 may be doped with impurity ions to provide a resistance pattern 16 as shown in FIGS. 1 and/or 3a-c. The resistance pattern 16 may have N- or P-type conductivity through implantation and/or diffusion of the impurity ions. Here, the resistance pattern 16 may be divided into first to third patterns 16-1, 16-2 and 16-3 and extensions 16-4, 16-5, 16-6 and 16-7 as shown in FIG. 1. The first to third patterns 16-1, 16-2 and 16-3 may be disposed from left to right in sequence to form an 'H' shape.

Figure 3A:
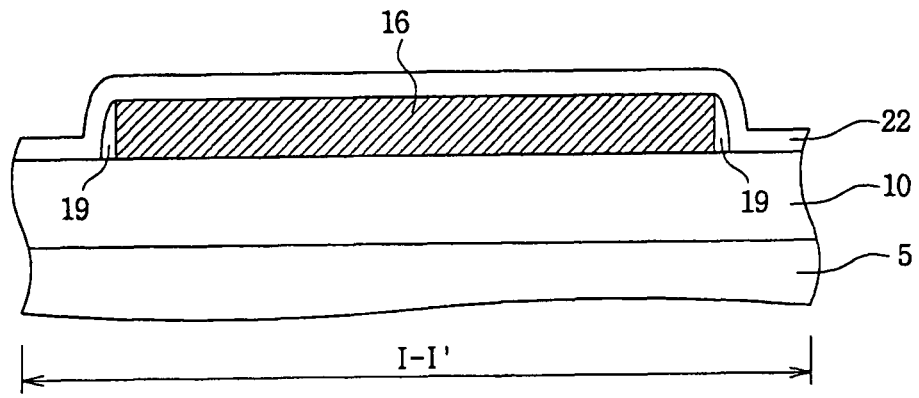
Figure 3B:
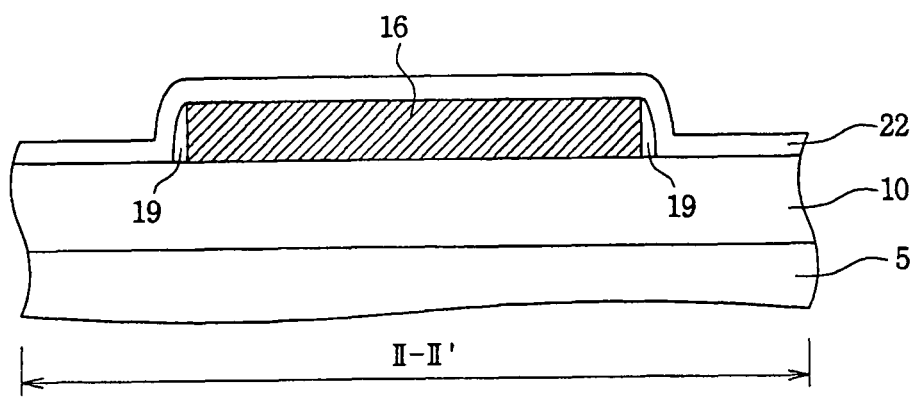
Figure 3C:
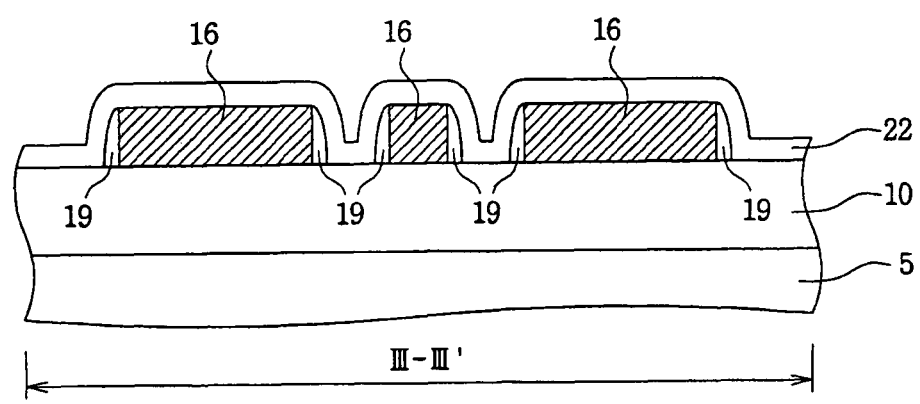

Meanwhile, the extensions 16-4, 16-5, 16-6 and 16-7 may respectively contact upper and lower ends of the 'H' shape and may be disposed parallel to the second pattern 16-2 to face the second pattern 16-2. Subsequently, spacers 19 may be formed on sidewalls of the resistance pattern 16 as shown in FIGS. 3a-c. The spacers 19 may include an insulating material such as silicon nitride. A barrier layer 22 may be formed on the pad layer 10 to cover the spacers 19 and the resistance pattern 16 as shown in FIGS. 3a-c. The barrier layer 22 may be formed of silicon oxide and/or silicon nitride.

Referring to FIGS. 1 and 4a-c, a photoresist pattern (not shown) may be formed on the barrier layer 22 (FIGS. 3a-c). The photoresist pattern may be formed using a photolithography process. The photoresist pattern may be formed to cover a central region of the resistance pattern 16 and to expose an outer region thereof. Using the photoresist pattern as an etching mask, the barrier layer 22 may be etched, and a barrier pattern 24 may be formed as shown in FIG. 1 and/or 4a-c. After the formation of the barrier pattern 24, the photoresist pattern may be removed from the semiconductor substrate 5.

The barrier pattern 24 may be formed to cover the first to third patterns 16-1, 16-2 and 16-3 and the extensions 16-4, 16-5, 16-6 and 16-7 and to expose edges opposite to sidewalls of the first pattern 16-1, the third pattern 16-3 and the extensions 16-4, 16-5, 16-6 and 16-7 facing the second pattern 16-2. Subsequently, a conductive layer 26 may be formed on the pad layer 10 to cover the resistance pattern 16, the spacers 19 and the barrier pattern 24. The conductive layer 26 may include a metal such as nickel (Ni), cobalt (Co) and/or tungsten (W).

Figure 5A:
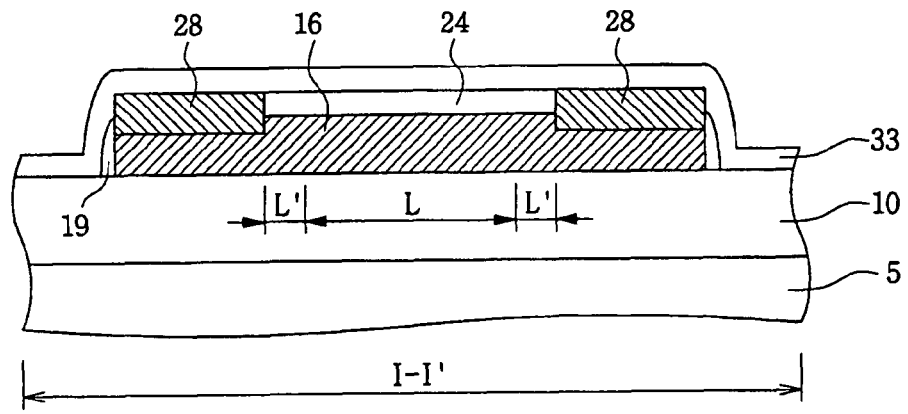
Figure 5B:
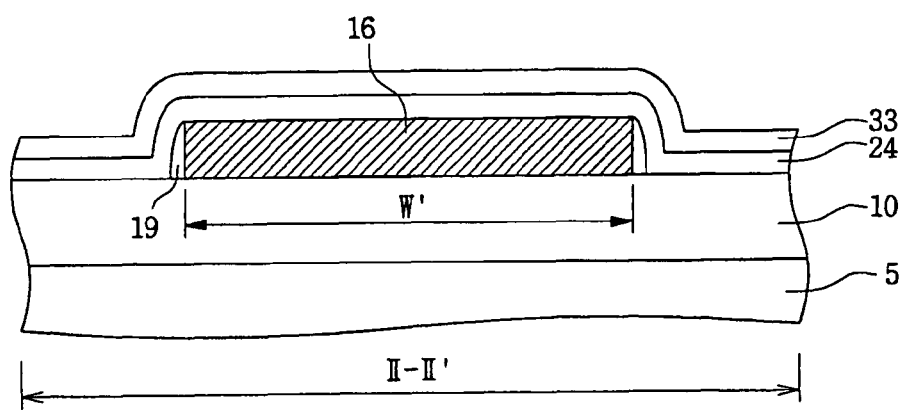
Figure 5C:
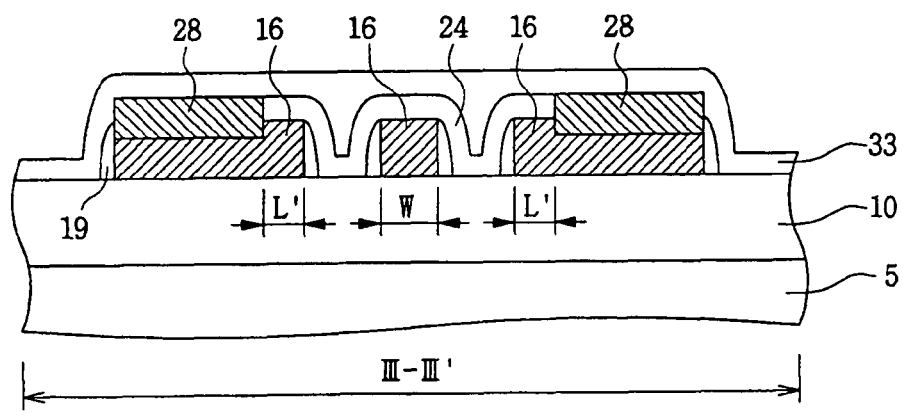

Referring to FIGS. 1 and 5a-c, a semiconductor thermal treatment may be performed on the conductive layer 26. The resistance pattern 16 and the conductive layer 26 may react during the semiconductor thermal treatment using the pad layer 10, the spacers 19 and the barrier pattern 24 as a mask, so that metal silicide may be formed on the resistance pattern 16. After performing the semiconductor thermal treatment, remaining portions of the conductive layer 26 around the metal silicide may be removed from the semiconductor substrate 5, and connection patterns 28 may thereby be formed using the metal silicide as shown in FIGS. 5a-c. The connection patterns 28 may be formed to surround the barrier pattern 24 and to be in contact with the resistance pattern 16.

Figure 4A:
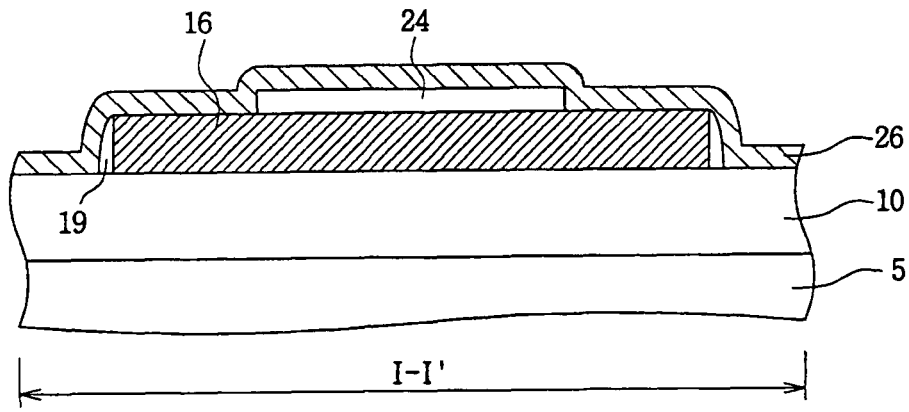
Figure 4B:
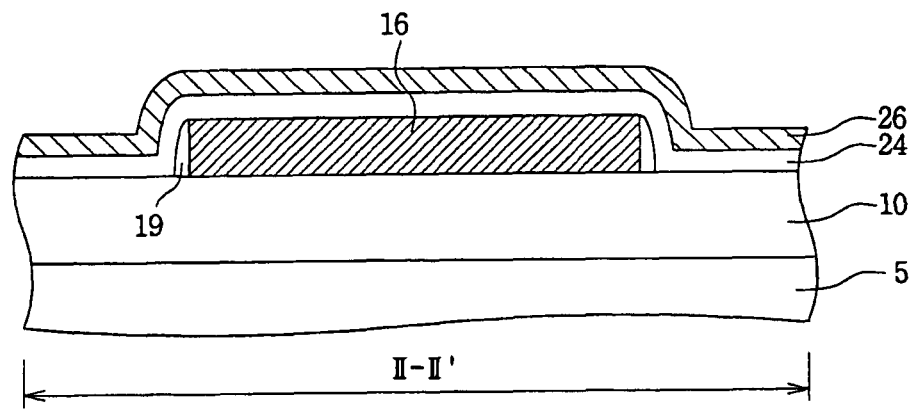
Figure 4C:
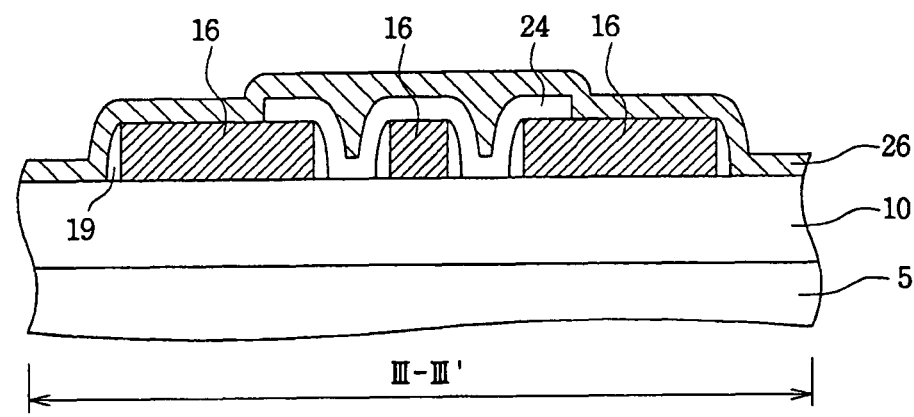

The connection patterns 28 may be formed on outer regions of the resistance pattern 16 exposed by the photoresist pattern, as described in FIGS. 4a-c. To this end, the connection patterns 28 may be formed on edges opposite to the sidewalls of the first pattern 16-1, the third pattern 16-3 and the extensions 16-4, 16-5, 16-6 and 16-7 facing the second pattern 16-2. The barrier pattern 24 and the connection patterns 28 may allow the second pattern 16-2 to have a length L and a width W as a resistance portion of the semiconductor resistor element 54 of FIG. 1. The barrier pattern 24 and the connection patterns 28 may also allow the first pattern 16-1, the third pattern 16-3 and the extensions 16-4, 16-5, 16-6 and 16-7 to have a length L' and a width W' as a resistance portion of the semiconductor resistor element 54 of FIG. 1. A protection layer 33 may be formed on the pad layer 10 to at least partially cover the connection patterns 28, the barrier pattern 24 and the spacers 19 as shown in FIGS. 5a-c. The protection layer 33 may include an insulating material such as silicon oxide and/or silicon nitride.

Referring to FIGS. 1 and 6a-c, an interlayer insulating layer 36 may be formed on the protection layer 33, and the interlayer insulating layer 36 may be formed of at least one insulating material. A photoresist layer (not shown) may be formed on the interlayer insulating layer 36 using a photolithography process. The photoresist layer may be formed to have openings respectively overlapping the connection patterns 28. Using the photoresist layer as an etching mask, the interlayer insulating layer 36 and the protection layer 33 may be sequentially etched to form contact holes 39 as shown in FIGS. 1 and/or 6a-c. After the formation of the contact holes 39, the photoresist layer may be removed from the semiconductor substrate 5.

Alternatively, the protection layer 33 may be omitted. If the protection layer 33 is omitted, the contact holes 39 may be formed to pass through the interlayer insulating layer 36 only. The contact holes 39 may be respectively aligned with the openings and may expose portions of the connection patterns 28. Plugs 44 may be formed of a conductive material respectively filling the contact holes 39 as shown in FIGS. 6a-c. The plugs 44 may include a metal such as tungsten (W). The plugs 44 may contact the connection patterns 28 through the contact holes 39.

A metal layer (not shown) may be formed on the interlayer insulating layer 36 to cover the plugs 44, and photoresist patterns may be formed on the metal layer using a photolithography process. The photoresist patterns may overlap the connection patterns 28, respectively. Using the photoresist patterns as an etching mask, the metal layer may be etched, and metal interconnections 48 may thus be formed as shown in FIGS. 1 and/or 6a-c. The metal interconnections 48 may be formed to contact the plugs 44. After the formation of the metal interconnections 48, the photoresist patterns may be removed from the semiconductor substrate 5. Consequently, the metal interconnections 48, the plugs 44 and the connection patterns 28 together with the resistance pattern 16 may provide the semiconductor resistor element 54.

FIGS. 8a-c, 9a-c, 10a-c and 11a-c are cross-sectional views respectively taken along lines I-I', II-II' and III-III' of FIG. 7 which illustrate methods of forming semiconductor resistor elements according to some embodiments of the present invention. The same reference numerals denote the same materials as discussed above with respect to FIGS. 2a-c, 3a-c, 4a-c, 5a-c, and/or 6a-c.

Referring to FIGS. 7a-c and 8a-c, a pad layer 10 may be formed on a semiconductor substrate 5. A resistance definition pattern 14 may be formed on the pad layer 10. The resistance definition pattern 14 may be formed of undoped polysilicon. The resistance definition pattern 14 may be a preliminary pattern used to form the resistance pattern 17 of FIG. 7. The resistance definition pattern 14 may be formed in a different shape from the resistance definition pattern 13 of FIGS. 2a-c as shown in FIGS. 1 and 7.

Referring to FIGS. 7 and 9a-c, impurity ions may be doped into the resistance definition pattern 14, and thereby the resistance pattern 17 may be formed as shown in FIG. 7 and/or 9a-c. The resistance definition pattern 14 may have N- or P-type conductivity through implantation and/or diffusion of the impurity ions. The resistance pattern 17 may be divided into first to third patterns 17-1, 17-2 and 17-3, extensions 17-4, 17-5, 17-6 and 17-7 and connection parts 17-8 as shown in FIG. 7. The first to third patterns 17-1, 17-2 and 17-3 may be formed from left to right in sequence to form an 'H' shape. The extensions 17-4, 17-5, 17-6 and 17-7 may be formed to respectively contact upper and lower ends of the 'H' shape and may be formed parallel to the second pattern 17-2 to face the second pattern 17-2.

Figure 9A:
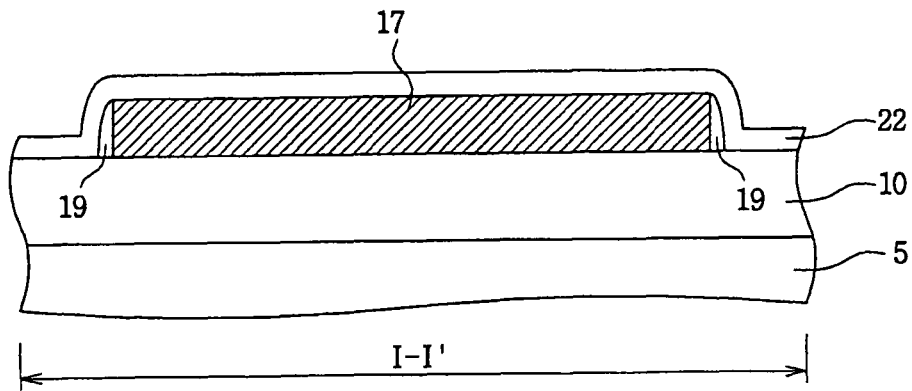
Figure 9B:
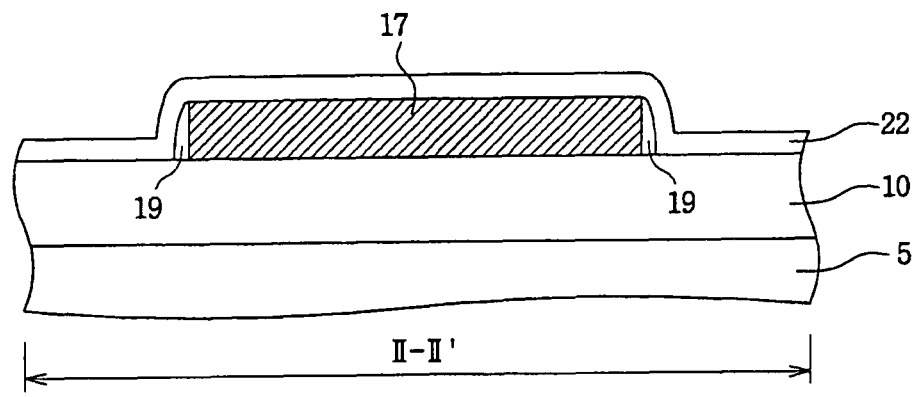
Figure 9C:
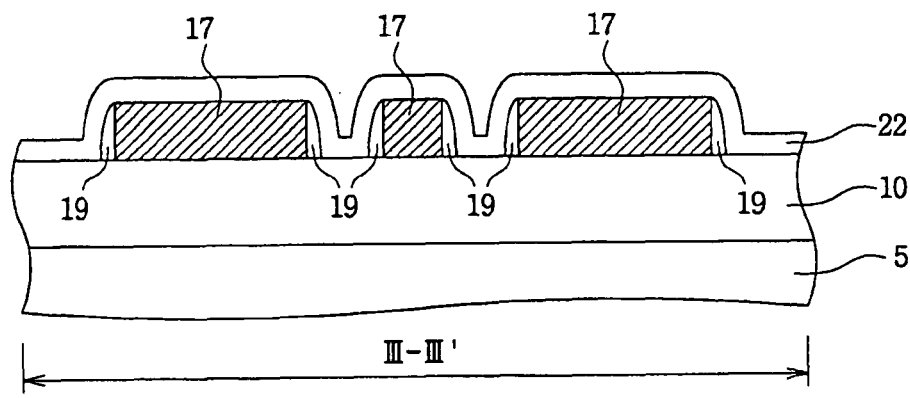
Figure 10A:
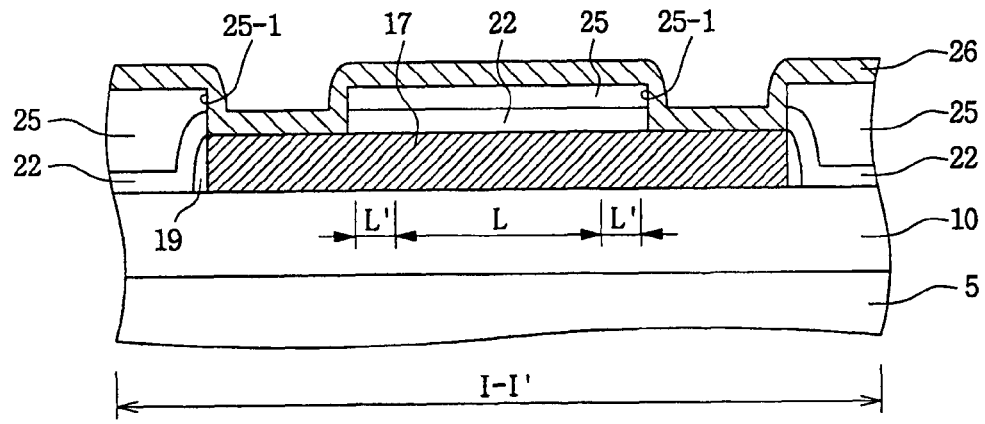
Figure 10B:
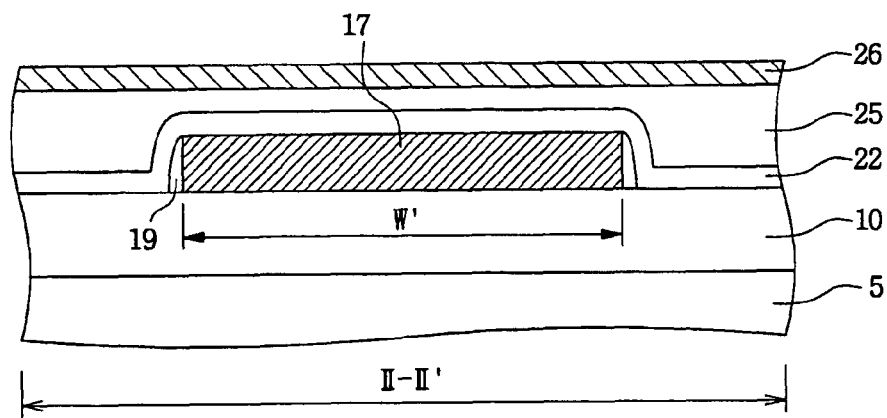
Figure 10C:
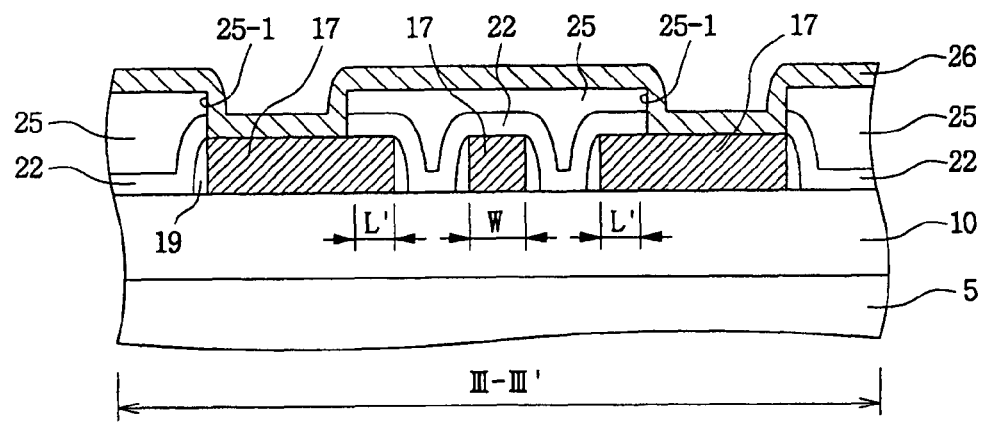

The connection parts 17-8 may be formed opposite to sidewalls of the first pattern 17-1, the third pattern 17-3 and the extensions 17-4, 17-5, 17-6 and 17-7 facing the second pattern 17-2 and formed to protrude from the first pattern 17-1, the third pattern 17-3 and the extensions 17-4, 17-5, 17-6 and 17-7. To maintain a proper resistance value of the resistance pattern 17, the connection parts 17-8 may extend along the first pattern 17-1, the third pattern 17-3 and the extensions 17-4, 17-5, 17-6 and 17-7 in arbitrary directions A1, A2, B1, B2, C1 and C2. Subsequently, spacers 19 may be formed on sidewalls of the resistance pattern 17 as shown in FIGS. 9a-c. A barrier layer 22 may be formed on the pad layer 10 to cover the spacers 19 and the resistance pattern 17.

Referring to FIGS. 7 and 10a-c, a buried insulating layer 25 may be formed on the barrier layer 22. The buried insulating layer 25 may include at least one insulating material. A photoresist layer may be formed on the buried insulating layer 25. The photoresist layer may be formed using a photolithography process. The photoresist layer may be formed to have openings respectively corresponding to the connection parts 17-8. Using the photoresist layer as an etching mask, the buried insulating layer 25 and the barrier layer 22 may be etched, and thus buried holes 25-1 may be formed as shown in FIGS. 7 and/or 8a-c. The buried holes 25-1 may be formed to be respectively aligned with the openings to expose the connection parts 17-8. After the formation of the buried holes 25-1, the photoresist layer may be removed from the buried insulating layer 25. A conductive layer 26 may be formed on the buried insulating layer 25 to fill the buried holes 25-1 as shown in FIG. 10.

Referring to FIGS. 7 and 11a-c, a semiconductor thermal treatment process may be performed on the conductive layer 26. The conductive layer 26 and the resistance pattern 17 may react during the semiconductor thermal treatment using the barrier layer 22 and the buried insulating layer 25 as a mask, so that metal silicide may be formed. After the formation of the metal silicide, the conductive layer 26 around the metal silicide may be removed from the semiconductor substrate 5, and thus connection patterns 29 may be formed using metal silicide as shown in FIGS. 1a-b. The connection patterns 29 may be formed around the resistance pattern 17 to contact the connection parts 17-8. Accordingly, the connection patterns 29 may allow the second pattern 17-2 to have a length L and a width W as a resistance portion of the semiconductor resistor element 58 of FIG. 7. The connection patterns 29 may also allow the first pattern 17-1, the third pattern 17-3 and the extensions 17-4, 17-5, 17-6 and 17-7 to have a length L' and a width W' as a resistance portion of the semiconductor resistor element 58 of FIG. 7. Alternatively, the barrier layer 22 may be omitted. If the barrier layer 22 is omitted, the buried holes 25-1 may be formed to pass through the buried insulating layer 25 only. To maintain a proper resistance value of the resistance pattern 17, the connection patterns 29 may extend together with the connection parts 17-8 along the first pattern 17-1, the third pattern 17-3 and the extensions 17-4, 17-5, 17-6 and 17-7.

Referring back to FIGS. 7 and 11a-c, a planarization interlayer insulating layer 37 may be formed on the buried insulating layer 25 to at least partially cover the connection patterns 29 as shown in FIGS. 11a-c. The planarization interlayer insulating layer 37 may include at least one insulating material, and a photoresist layer may be formed on the planarization interlayer insulating layer 37. The photoresist layer may be formed using a photolithography process. The photoresist layer may be formed having openings respectively corresponding to the connection patterns 29. Using the photoresist layer as an etching mask, the planarization interlayer insulating layer 37 may be etched to form contact holes 40 as shown in FIG. 7 or 11a-c. The contact holes 40 may be formed to be respectively aligned with the openings to expose portions of the connection patterns 29. After forming the contact holes 40, the photoresist layer may be removed from the semiconductor substrate 5.

Plugs 44 may be formed of a conductive material to respectively fill the contact holes 40 as shown in FIGS. 11a-c. A metal layer (not shown) may be formed on the planarization interlayer insulating layer 37 to cover the plugs 44. Photoresist patterns (not shown) may be formed on the metal layer using a photolithography process. The photoresist patterns may overlap the connection patterns 29. Using the photoresist patterns as an etching mask, the metal layer may be etched to form metal interconnections 48 as shown in FIG. 7 or 11a-c. The metal interconnections 48 may contact the plugs 44. After forming the metal interconnections 48, the photoresist patterns may be removed from the semiconductor substrate 5. Consequently, the metal interconnections 48, the plugs 44 and the connection patterns 29 together with the resistance pattern 17 may provide the semiconductor resistor element 58.

As described above, some embodiments of the present invention may provide semiconductor resistor elements and/or a methods of forming the same. According to some embodiments of the present invention, extensions in a resistance pattern may compensate for optical interference when performing a photolithography process. According to some embodiments of the present invention, a semiconductor fabrication process may allow a resistance pattern to maintain a proper resistance value using extensions in the resistance pattern.

While the present invention has been particularly shown and described with reference to embodiments thereof, it will be understood by those of ordinary skill in the art that various changes in form and details may be made therein without departing from the spirit and scope of the present invention as defined by the following claims.

What is claimed is:
1. A semiconductor device comprising:
a substrate;
a resistance pattern comprising a resistance material on the substrate, the resistance pattern comprising,
  first and second spaced apart base elements, wherein the first, and second base elements are substantially parallel,
  a bridge element connected between respective center portions of the first and second spaced apart base elements, and
  first, second, third, and fourth extension elements, wherein the first and second extension elements are connected to opposite ends of the first base element, extend toward the second base element and are disposed parallel with respect to the bridge element, wherein the third and fourth extension elements are, connected to opposite ends of the second base element, extend toward the first base element and are disposed parallel with respect to the bridge element, and wherein the respective first and second extension elements face the respective third and fourth extension elements;
a first conductive pattern comprising a conductive material on the first base element wherein the first conductive pattern is spaced apart from an edge of the first base element adjacent the bridge element, wherein the conductive material and the resistance material are different;
a second conductive pattern comprising the conductive material on the second base element wherein the second conductive pattern is spaced apart from an edge of the second base element adjacent the bridge element;
an interlayer insulating layer on the resistance pattern and on the first and second conductive patterns, the interlayer insulating layer having at least one first hole therein exposing a portion of the first conductive pattern and at least one second hole therein exposing a portion of the second conductive pattern;
a first conductive interconnection layer on the interlayer insulating layer electrically connected to the first conductive pattern through the at least one first hole; and
a second conductive interconnection layer on the interlayer insulating layer electrically connected to the second conductive pattern through the at least one second hole.

2. A semiconductor device according to claim 1 further comprising:
an insulating barrier layer on portions of the first base element between the first conductive pattern and the edge of the first base element adjacent the bridge element, and on portions of the second base element between the second conductive pattern and the edge of the second base element adjacent the bridge element.

3. A semiconductor device according to claim 1 wherein the resistance material comprises polysilicon, wherein the conductive material comprises a metal silicide, and wherein the first and second conductive interconnection layers comprise a metal.

4. A semiconductor device according to claim 1 further comprising:
a plurality of conductive plugs in respective ones of the first and second holes, wherein the plurality of conductive plugs provide electrical connection between the conductive interconnection layers and the respective conductive patterns.

5. A semiconductor device according to claim 1 wherein the bridge element is perpendicular with respect to the first and second base elements.

6. A semiconductor device according to claim 1 wherein the resistance material comprises doped polysilicon.

7. A semiconductor device according to claim 1 wherein the substrate comprises a semiconductor layer and an insulating pad layer on the semiconductor layer so that the insulating pad layer is between the semiconductor layer and the resistance pattern.

8. A method of forming semiconductor device, the method comprising:
   forming a resistance pattern comprising a resistance material on a substrate, the resistance pattern comprising, first and second spaced apart base elements wherein the first and second base elements are substantially parallel, a bridge element connected between respective center portions of the first and second spaced apart base elements, and first, second, third, and fourth extension elements wherein the first and second extension elements are connected to opposite ends of the first base element, extend toward the second base element and are disposed parallel to the bridge element, wherein the third and, fourth extension elements are connected to opposite ends of the second base element, extend toward the first base element and are disposed parallel to the bridge element, and wherein the respective first and second extension elements face the respective third and fourth extension elements;
   forming an insulating barrier pattern on the bridge element and on first portions of the base elements and extension elements adjacent the bridge element with second portions of the base elements and extension elements being more distant than the first portions of the base elements and extension elements from the bridge element and with the second portions of the base elements and extension elements being free of the insulating barrier pattern;
   forming a first conductive pattern comprising a conductive material on the second portions of the first base element and on the second portions of the first and second extension elements that are free of the insulating barrier layer wherein the conductive material and the resistance material are different; and
   forming a second conductive pattern comprising the conductive material on the second portions of the second base element and on the second portions of the third and fourth extension elements that are free of the insulating barrier layer.

9. A method according to claim 8 further comprising:
   forming an interlayer insulating layer on the resistance pattern, on the insulating barrier pattern, and on the first and second conductive patterns, the interlayer insulating layer having at least one first hole therein exposing a portion of the first conductive pattern and at least one second hole therein exposing a portion of the second conductive pattern; and
   forming first and second conductive interconnection layers on the interlayer insulating layer with the first conductive interconnection layer being electrically connected to the first conductive pattern through the at least one first hole, and with the second conductive interconnection layer being electrically connected to the second conductive pattern through the at least one second hole.

10. A method according to claim 9 wherein the resistance material comprises polysilicon, wherein the conductive material comprises a metal silicide, and wherein the first and second conductive interconnection layers comprise a metal.

11. A method according to claim 9 further comprising:
   before forming the first and second conductive interconnection layers, forming a plurality of conductive plugs in respective ones of the first and second holes, wherein the plurality of conductive plugs provide electrical connection between the conductive interconnection layers and the respective conductive patterns.

12. A method according to claim 8 wherein the bridge element is perpendicular with respect to the first and second base elements.

13. A method according to claim 8 wherein the resistance material comprises doped polysilicon.

14. A method according to claim 8 wherein the substrate comprises a semiconductor layer and an insulating pad layer on the semiconductor layer so that the insulating pad layer is between the semiconductor layer and the resistance pattern.

15. A semiconductor device according to claim 1 wherein the first and second base elements are perpendicular with respect to the bridge element, wherein the first, second, third, and fourth extension elements are perpendicular with respect to the first and second base elements, wherein the first and second extension elements extend from opposite ends of the first base element toward the second base element parallel with respect to the bridge element, wherein the third and fourth extension elements extend from opposite ends of the second base element toward the first base element parallel with respect to the bridge element, wherein the first, second, third, and fourth extension elements are spaced apart from the bridge element, and wherein the first, second, third, and fourth extension elements, the bridge element, and the first and second base elements all comprise the resistance material.

16. A method according to claim 8 wherein the first and second base elements are perpendicular with respect to the bridge element, wherein the first, second, third, and fourth extension elements are perpendicular with respect to the first and second base elements, wherein the first and second extension elements extend from opposite ends of the first base element toward the second base element parallel with respect to the bridge element, wherein the third and fourth extension elements extend from opposite ends of the second base element toward the first base element parallel with respect to the bridge element, wherein the first, second, third, and fourth extension elements are spaced apart from the bridge element, and wherein the first, second, third, and fourth extension elements, the bridge element, and the first and second base elements all comprise the resistance material.

* * * * *